United States Patent
Nakaya et al.

(10) Patent No.: US 12,538,730 B2
(45) Date of Patent: Jan. 27, 2026

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Kazuo Nakaya, Toyama (JP); Fumie Ando, Toyama (JP); Susumu Nishiura, Toyama (JP); Hiroshi Ekko, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 732 days.

(21) Appl. No.: 17/683,051

(22) Filed: Feb. 28, 2022

(65) Prior Publication Data

US 2022/0310413 A1 Sep. 29, 2022

Related U.S. Application Data

(63) Continuation of application No. PCT/JP2020/035265, filed on Sep. 17, 2020.

(51) Int. Cl.
*H01L 21/67* (2006.01)
(52) U.S. Cl.
CPC .. *H01L 21/67017* (2013.01); *H01L 21/67253* (2013.01)
(58) Field of Classification Search
None
See application file for complete search history.

(56) References Cited

U.S. PATENT DOCUMENTS

2013/0183443 A1* 7/2013 Hirose ............. C23C 16/45561
118/712
2018/0024536 A1 1/2018 Yoneda

FOREIGN PATENT DOCUMENTS

| JP | H05190460 | * | 7/1993 |
| JP | H06-034072 A | | 2/1994 |
| JP | 2005-183865 A | | 7/2005 |

(Continued)

OTHER PUBLICATIONS

English translation of JPH05190460.*
(Continued)

*Primary Examiner* — Charles Capozzi
(74) *Attorney, Agent, or Firm* — Volpe Koenig (57) ABSTRACT

There is provided a technique that includes a processor configured to be capable of executing a process recipe to process a substrate; and a pressure controller configured to be capable of controlling a pressure of a process chamber, in which the substrate is processed, by adjusting an opening degree of a pressure regulating valve provided to an exhaust line of the process chamber, wherein when controlling the pressure of the process chamber, the pressure controller adjusts the opening degree of the pressure regulating valve and outputs information of the opening degree, and wherein while receiving the information of the opening degree from the pressure controller and monitoring an open/close state of the pressure regulating valve, the processor is configured to, when the information of the opening degree is a preset value, be capable of determining whether or not opening/closing of the pressure regulating valve happens.

14 Claims, 5 Drawing Sheets

(56) References Cited

FOREIGN PATENT DOCUMENTS

| JP | 2012-140982 A | | 7/2012 |
|---|---|---|---|
| JP | 2014093497 | * | 5/2014 |
| WO | 2016/157402 A1 | | 10/2016 |

OTHER PUBLICATIONS

English translation of JP2014093497.*
English translation of JPH05190460 (2025).*
English translation of JP2014093497 (2025).*
International Search Report and English Translation, PCT/JP2020/035265 dated Nov. 24, 2020 (5 pgs).

* cited by examiner

SUBSTRATE PROCESSING APPARATUS, METHOD OF MANUFACTURING SEMICONDUCTOR DEVICE, AND RECORDING MEDIUM

CROSS-REFERENCE TO RELATED APPLICATIONS

This application is a Bypass Continuation application of PCT International Application No. PCT/JP2020/035265, filed on Sep. 17, 2020, the international application being based upon claiming the benefit of priority from Japanese Patent Application No. 2019-174037, filed on Sep. 25, 2019, the entire contents of which are incorporated herein by reference.

TECHNICAL FIELD

The present disclosure relates to a substrate processing apparatus, a method of manufacturing a semiconductor device, and a recording medium.

BACKGROUND

As a method of determining the replacement time of a pressure control valve such as an APC (Auto Pressure Controller) valve, for example, a technique for determining the valve replacement time based on the number-of-times of opening/closing a pressure control valve is known in the related art. According to this technique, the valve can be replaced in advance before a threshold value is reached (before failure), but the time for stopping an apparatus due to the maintenance time may increase. Further, for example, the valve replacement time may be determined based on the number-of-times of fully opening/fully closing a valve (FULL OPEN/FULL CLOSE). In this case, because valve operations (during automatic pressure control, etc.) other than full opening/full closing of a valve (FULL OPEN/FULL CLOSE) may not be counted as the number-of-times, the count number may not be accurate. Therefore, there is a possibility that the number-of-times of valve opening/closing and the number of counts are different from each other when a failure occurs. Therefore, for example, there is a possibility that the pressure control valve is replaced after it fails during film formation.

SUMMARY

Some embodiments of the present disclosure provide a technique capable of knowing in advance a criterion for the timing of replacement of a pressure control valve.

According to one embodiment of the present disclosure, there is provided a technique that includes a processor configured to be capable of executing a process recipe to process a substrate; and a pressure controller configured to be capable of controlling a pressure of a process chamber, in which the substrate is processed, by adjusting an opening degree of a pressure regulating valve provided to an exhaust line of the process chamber, wherein when controlling the pressure of the process chamber, the pressure controller adjusts the opening degree of the pressure regulating valve and outputs information of the opening degree to the processor, and wherein while receiving the information of the opening degree from the pressure controller and monitoring an open/close state of the pressure regulating valve, the processor is configured to, when the information of the opening degree is a preset value, be capable of determining whether or not opening/closing of the pressure regulating valve happens, based on the information of the opening degree being monitored and a predetermined threshold value larger than the preset value.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. However, in the following description, the same constituent elements are denoted by the same reference numerals, and explanation thereof may not be described.

(Substrate Processing Apparatus)

A configuration of a substrate processing apparatus according to an embodiment of the present disclosure is described with reference to FIG. 1.

Figure 1:
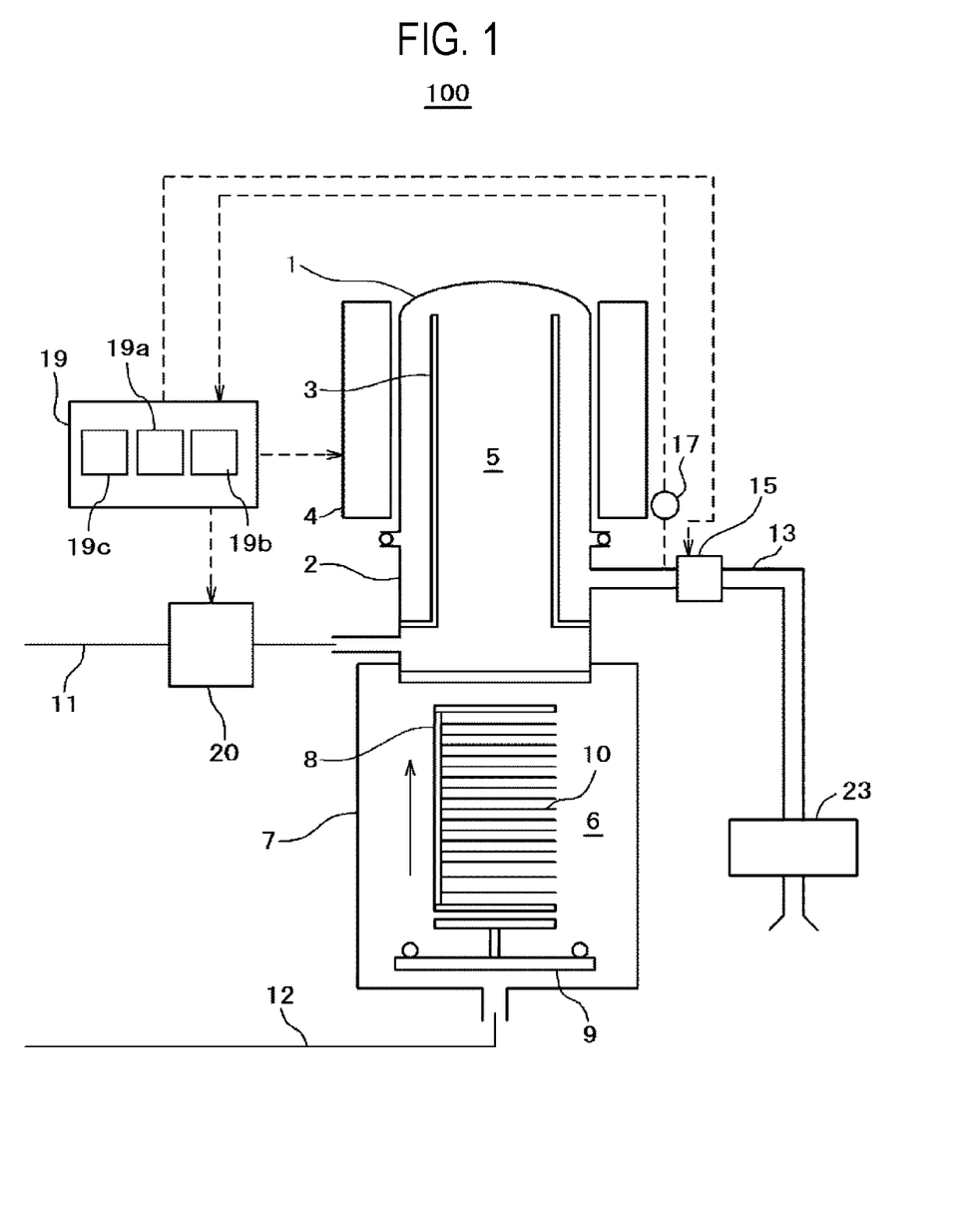
FIG. 1 is a schematic configuration view of a substrate processing apparatus according to an embodiment of the present disclosure.

As shown in FIG. 1, a reaction tube 1 of the substrate processing apparatus 100 in the embodiment is installed to be erected on a furnace opening flange 2, and an inner tube 3 is supported to be concentric with the reaction tube 1 on the furnace opening flange 2. Further, a cylindrical heater 4 is provided to surround the reaction tube 1. A reaction furnace includes the heater 4, the reaction tube 1, and the furnace opening flange 2.

An interior of the reaction tube 1 is an airtight process chamber 5, the process chamber 5 is in fluid communication with an airtight spare chamber 6, and the spare chamber 6 is defined by a transfer housing 7 that is installed to be continuous to the furnace opening flange 2. The transfer housing 7 is provided with a boat elevator (not shown) as a furnace entering/exiting mechanism, and a boat 8 as a substrate holder is loaded into and unloaded from the process chamber 5 by the boat elevator. Further, when the boat 8 is loaded, the process chamber 5 is air-tightly closed by a furnace opening cover 9.

A gate valve (not shown) is provided in the transfer housing 7, a wafer transfer device (not shown) is provided outside the transfer housing 7, and the boat 8 is accommodated in the transfer housing 7. In this state, a substrate 10 such as a wafer is transferred to the boat 8 via the gate valve by the wafer transfer device.

The furnace opening flange 2 is in fluid communication with a gas introduction line 11 to introduce gas into the process chamber 5 from below the inner tube 3, and a gas introduction line 12 communicates with the spare chamber 6. Further, the furnace opening flange 2 is in fluid communication with an exhaust line 13, and the exhaust line 13 is connected to a vacuum pump 23 via an APC valve 15 as a pressure regulating valve.

A pressure detector 17 is provided to the exhaust line 13, and a pressure detection result of the pressure detector 17 is input to a controller 19.

A flow rate controller 20 is provided to the gas introduction line 11, and the flow rate controller 20 controls a flow rate of the gas supplied from the gas introduction line 11 to the process chamber 5 according to a command from the controller 19. Further, the flow rate controller 20 may be configured to be capable of controlling the flow rate of gas supplied from the gas introduction line 12 to the spare chamber 6.

The process chamber 5 can be put into a vacuum state or a depressurized state by closing the flow rate controller 20 by the controller 19 to stop supplying the gas and opening the APC valve 15 to evacuate the process chamber 5 by the vacuum pump 23.

Further, with the APC valve 15 opened to evacuate the process chamber 5 by the vacuum pump 23, a pressure detection signal from the pressure detector 17 is fed back to the controller 19, and the controller 19 controls the flow rate controller 20 to adjust the flow rate of the introduced gas so that a pressure detected by the pressure detector 17 becomes a set pressure.

As described above, the pressure of the process chamber 5 is controlled to a predetermined pressure (for example, the set pressure) by the controller 19 to control the gas flow rate introduced into the process chamber 5 and the gas exhaust amount exhausted from the process chamber 5. Further, the temperature of the process chamber 5 is controlled to a predetermined temperature by the controller 19 to control an amount of heat generation of the heater 4. In this operation, an inert gas, for example, a nitrogen gas, may be used as the gas supplied via the gas introduction line 11.

With a predetermined number of substrates 10 charged in the boat 8, the boat 8 is loaded into the process chamber 5 (boat loading step). Next, the process chamber 5 is evacuated from an atmospheric pressure and is controlled to a predetermined temperature by being heated by the heater 4 while being controlled to a predetermined pressure (preparation step). This preparation step may be included in a substrate processing step. Under a predetermined depressurized state and a predetermined temperature maintenance state, a process gas is introduced from the gas introduction line 11 and is exhausted, and the process gas is supplied to the substrate 10, so that wafer processing (substrate processing) such as thin film formation is performed (substrate processing step). When the processing is completed, the boat 8 is lowered (boat unloading step), and the processed substrate 10 is discharged. As the thin film, for example, a SiN film (silicon nitride film) is formed.

The APC valve 15 is configured to be capable of performing and stopping an operation of vacuum exhaust of the process chamber 5 by opening/closing a valve provided inside in a state where the vacuum pump 23 is operated, and further to adjust the pressure of the process chamber 5 by adjusting the valve opening degree based on the pressure information detected by the pressure detector 17 in a state where the vacuum pump 23 is operated.

A processor 19a included in the controller 19 is configured as a computer including a CPU (Central Processing Unit), a RAM (Random Access Memory) configured as a memory area (work area) in which programs, data, and the like read by the CPU are temporarily stored, a storage device (memory) in which a control program that controls the operation of the substrate processing apparatus 100, a process recipe in which procedures and conditions of pressure control, etc. are written, and the like, are readably stored. Here, the data in the memory area is configured to be capable of transferring to the memory at predetermined intervals.

The process recipe functions as a program for causing the processor 19a to execute each step in a semiconductor device manufacturing method, to obtain a desired result. Hereinafter, the process recipe and the control program are generally and simply referred to as a "program." When the term "program" is used herein, it may indicate a case of including the process recipe a case of including the control program, or a case of including both the process recipe and the control program.

A pressure controller 19b included in the controller 19 controls the pressure of the process chamber 5 by adjusting an opening degree of the APC valve 15 provided to the exhaust line 13. In other words, the pressure controller 19b sets the pressure of the process chamber 5 to a predetermined pressure by adjusting the opening degree of the APC valve 15, and outputs a monitor value of the valve opening degree as information of the opening degree of the APC valve 15 to the processor 19a. The processor 19a monitors an open/close state of the APC valve 15 by the monitor value while receiving the monitor value of the valve opening degree from the pressure controller 19b. For example, the monitor value of the valve opening degree is stored in the memory area of the processor 19a. Then, after determining the open/close state of the valve opening, which will be described later, the monitor value of the valve opening degree in the memory area is transferred to the memory or deleted, and the monitor value of the valve opening degree is stored in the memory area of the processor 19a.

The processor 19a counts the number of times of valve operations of the APC valve 15 in a region of a certain opening/closing operation amount including "FULL OPEN" and "FULL CLOSE" based on the information of the opening degree of the APC valve 15, to thereby detect a criterion for a time of failure of a part, which is not such a part as guaranteed for the durability. This makes it possible to know in advance a criterion timing for valve replacement so that the valve will not be replaced after it breaks down during film forming. The details thereof will be described below.

"FULL CLOSE" indicates 0% openness and "FULL OPEN" indicates 100% openness. The opening/closing (opening degree) of the valve is determined with two threshold values, that is, a lower limit value of the valve opening degree as a first set value and an upper limit value of the valve opening degree as a second set value. These two threshold values (the lower limit value and the upper limit value of the valve opening degree) are preset in the storage device (memory) of the processor 19a. However, for the pressure controller 19*b* to control the valve opening degree to reach a target predetermined pressure, for example, it is possible to check a trace value of the valve opening degree as a result of executing a recipe by setting-up or the like and set in the memory the lower limit value and the upper limit value of the valve opening degree, which are used for setting opening degrees deemed as opening and closing of the valve. Here, the lower limit value and the upper limit value of the valve opening degree can be set on a configuration screen displayed by an operator 19*c* included in the controller 19. The lower limit value of the valve opening degree is greater than 0% and less than 50%, for example, 20%, and the upper limit value of the valve opening degree is greater than 50% and less than 100%, for example, 80%. In addition, when the substrate is being processed in the substrate processing step in the film-forming recipe, the lower limit value of the valve opening degree is determined such that a minute fluctuation value of the valve opening degree during pressure control falls within a range below the lower limit value of the valve opening degree. That is, the opening/closing operation with a small swing width while executing pressure control is set not to be a target for which valve opening/closing is counted. The valve may be operated manually, and the processor 19*a* may collect valve opening degree data even when a recipe is not being executed.

Figure 2:
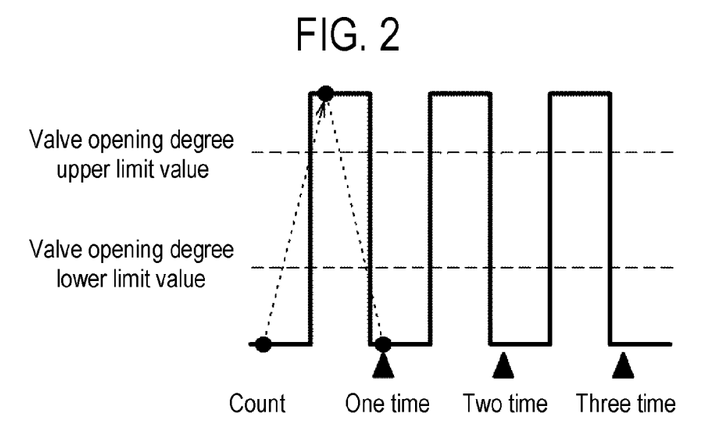
FIG. 2 is a diagram for explaining counting a valve opening/closing number-of-times in the embodiment of the present disclosure.
Figure 3:
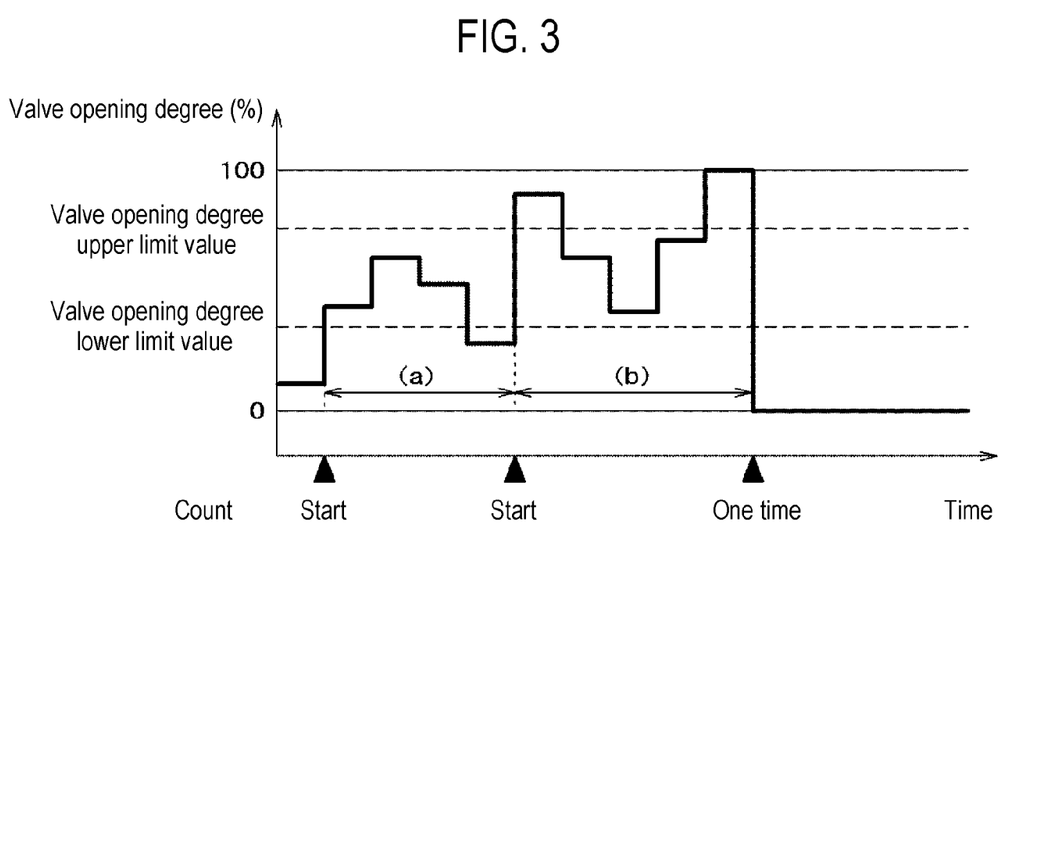
FIG. 3 is a diagram for explaining a period in which the valve opening/closing number-of-times is not counted in the embodiment of the present disclosure.

When receiving a monitor value of the valve opening degree of the APC valve 15 from the pressure controller 19*b*, the processor 19*a* monitors the monitor value of the valve opening degree. For example, as shown in FIG. 2, when the monitor value of the valve opening degree transitions from the lower limit value of the valve opening degree or less to the upper limit value of the valve opening degree or more, and further transitions to the lower limit value of the valve opening degree or less, the processor 19*a* counts up a count value of a number-of-times of valve opening/closing once. In short, the processor 19*a* determines whether or not valve opening/closing happens when the monitor value of the valve opening degree is the lower limit value of the valve opening degree. At this time, it is checked whether the monitor value of the valve opening degree acquired during monitoring reaches the lower limit value of the valve opening degree after passing through the upper limit value of the valve opening degree. If all the monitor values of the valve opening degree acquired during monitoring are smaller than the upper limit value of the valve opening degree, it is determined that the valve has not been opened/closed. Then, when the determination of an open/close state of the valve opening degree is completed, the monitor value of the valve opening degree monitored so far is cleared, and the monitoring of the valve opening degree is started. Next, FIG. 3 is described in more detail. In FIG. 3, when the monitor value of the valve opening degree reaches the lower limit value of the valve opening degree from less than the lower limit value of the valve opening degree, the processor 19*a* starts determining whether valve opening/closing happens or not. In this operation, at a point of time when the monitor value of the valve opening degree transitions from a value more than the upper limit value of the valve opening degree to the lower limit value of the valve opening degree, the processor 19*a* determines that the valve opening/closing happens, and counts up the number-of-times of opening/closing of the valve. In this way, by monitoring the transition of the monitor value of the valve opening degree acquired from the pressure controller 19*b* while the monitor value of the valve opening degree is the valve opening degree lower limit value, the number-of-times of valve opening/closing can be counted more appropriately. In short, the processor 19*a* starts determining whether or not valve opening/closing happens when the monitor value of the valve opening reaches the lower limit value of the valve opening degree, and the processor 19*a* starts counting the number-of-times of valve opening/closing when the monitor value of the valve opening degree reaches the lower limit value of the valve opening degree and the determination of valve opening/closing is completed (when it is determined that the valve opening/closing is performed). Further, the monitoring of the valve opening degree may be started when the valve opening degree is less than the lower limit value, or when the valve is fully closed (the monitoring value of the valve opening degree is 0%).

As in a period (a) in FIG. 3, when the monitor value of the valve opening degree becomes the lower limit value of the valve opening degree or more from less than the lower limit value of the valve opening degree and transitions to the lower limit value of the valve opening degree or less without becoming the upper limit value of the valve opening degree or more, the processor 19*a* determines that there is no valve opening/closing because the monitor value of the valve opening degree is smaller than the upper limit value of the valve opening degree between the monitor values of the valve opening degree at the lower limit value of the valve opening degree, and does not count up the number-of-times of valve opening/closing. In other words, the processor 19*a* determines that there is no valve opening/closing when the maximum value of the valve opening monitor value has not reached the valve upper limit value until the monitor value of the valve opening degree rises from the lower limit value of the valve opening degree and returns to the lower limit value of the valve opening degree. Accordingly, the processor 19*a* does not count up the number-of-times of valve opening/closing.

Further, as in a period (b) in FIG. 3, the processor 19*a* does not count up the count value of the number-of-times of valve opening/closing for a period in which the monitor value of the valve opening degree becomes from less than the lower limit value of the valve opening degree to the upper limit value of the valve opening degree or more and then does not becomes the lower limit value of the valve opening degree or less. Therefore, since the monitor value of the valve opening degree exceeds the lower limit value of the valve opening degree until the monitor value of the valve opening degree transitions to the lower limit value of the valve opening degree, the processor 19*a* does not count up the count value of the number-of-times of valve opening/closing as the upper limit value is exceeded a plurality of times, and the number-of-times of valve opening/closing is counted as one time. Therefore, in the valve opening degree sequence as shown in FIG. 3, although the upper limit value of the valve opening degree is exceeded twice, since the processor 19*a* determines the valve opening/closing happens once, the count of the number-of-times of valve opening/closing is once.

Since the count of the number-of-times of valve opening/closing is performed with an operation between a value from 0% of the opening degree (FULL CLOSE) to the lower limit value of the valve opening degree and a value from the upper limit value of the valve opening degree to 100% of the opening degree (FULL OPEN), it is possible to count the number-of-times of opening/closing of a part (valve) that deteriorates even if "FULL CLOSE" or "FULL OPEN" is not reached. Since the lower limit value of the valve opening degree is determined such that a fluctuation value of the valve opening degree during pressure control in the film-forming recipe falls within a range below the lower limit value of the valve opening degree, the number-of-times of valve opening/closing can be counted, for example, even when the APC valve 15 is set to "FULL OPEN" while the pressure control is being performed in the film-forming recipe, the number of times the valve is opened and closed can be counted.

Figure 4:
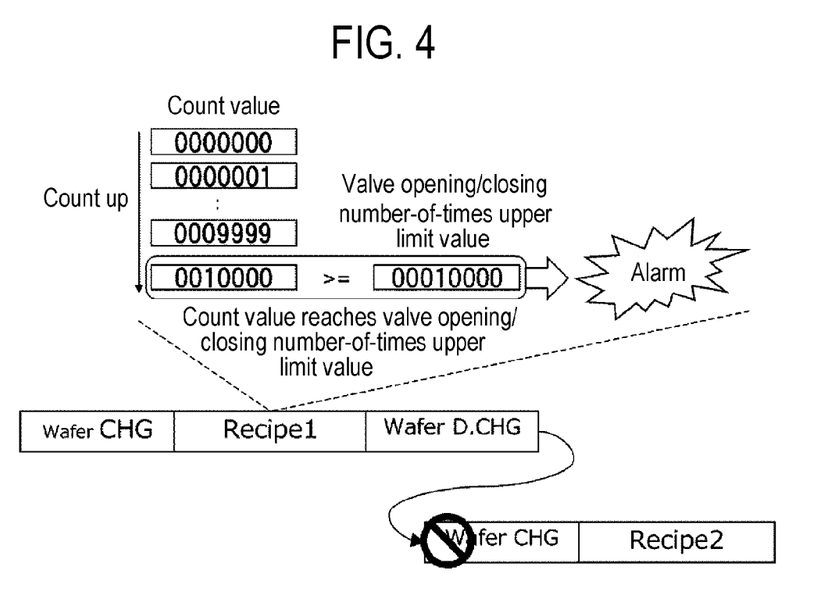
FIG. 4 is a diagram for explaining determining an upper limit of the valve opening/closing number-of-times and processing when the upper limit of the valve opening/closing number-of-times is reached in the embodiment of the present disclosure.

The processor 19a determines the number-of-times of valve opening/closing counted as described above by using a threshold value of an upper limit value. The number of times before reaching an endurance number-of-times of the APC valve 15 is set as the upper limit value for the number-of-times of valve opening/closing, and when the count value of the number-of-times of valve opening/closing reaches the upper limit value, a user is notified of a valve replacement time by an alarm report. For example, as shown in FIG. 4, the upper limit value of the number-of-times of valve opening/closing is set to 10,000 times, and an alarm is issued when the count value reaches 10,000 while executing Recipe 1. Further, for example, as the wafer discharge (Wafer D.CHG) after the film-forming recipe of Recipe 1, that is, the boat unloading step, is completed, the wafer charge (Wafer CHG) before the start of the film-forming recipe of next Recipe 2, that is, the boat loading step, is stopped for the valve replacement work, so certain process when replacing the valve (for example, valve replacement) can be executed. The upper limit value of the number-of-times of valve opening/closing is set based on a manufacturer's guaranteed value or a past example of the number-of-times of valve opening/closing until a failure.

In the present embodiment, when the monitor value of the valve opening degree becomes the lower limit value of the valve opening degree or more from less than the lower limit value of the valve opening degree, the monitoring for whether or not the valve opening/closing happens is started. However, when the monitor value of the valve opening degree becomes the upper limit value of the valve opening degree or more, the monitoring for whether or not the valve opening/closing happens may be started. In this case, when the monitor value of the valve opening degree becomes the lower limit value of the valve opening degree, it is determined that there is valve opening/closing, and the count value of the number-of-times of valve opening/closing is counted up.

Figure 5A:
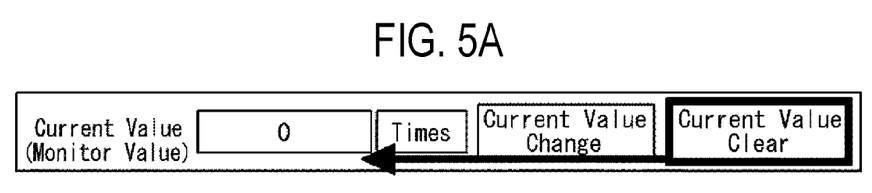
FIGS. 5A and 5B are diagrams for explaining a function of changing a current value of the valve opening/closing number-of-times in the embodiment of the present disclosure.

If the APC valve is replaced with a new one due to a failure of the APC valve while the present disclosure is applied to perform the count of the number-of-times of valve opening/closing, the number-of-times of valve opening/closing can be set to 0 time by the processor 19a or a host controller. For example, as shown in FIG. 5A, the current value, which is the monitor value of the number-of-times of valve opening/closing, is set to 0 time by a current value clear button.

Figure 5B:
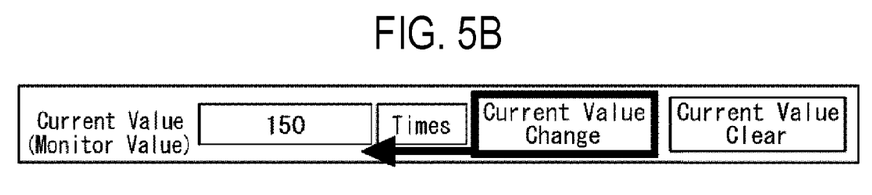

Further, if the present disclosure is applied to the APC valve for which the number-of-times of valve opening/closing has already been counted without applying the present disclosure, the processor 19a or the host controller (not shown) may set a certain offset value as the number-of-times of valve opening/closing. For example, as shown in FIG. 5B, the current value, which is the monitor value of the number-of-times of valve opening/closing is set to 150 times by a current value change button. This function is used when replacing the pressure controller without replacing the APC valve being used. The numerical value to be set (150 in this case) is obtained, for example, by calculating the number-of-times valve opening/closing of the present disclosure from the past recipes performed.

In the present embodiment, it is described that the monitor value of the opening degree of the APC valve is monitored for a period in which the pressure is controlled during the execution of the process recipe. However, without limited to this period, the monitor value of the opening degree of the APC valve may be monitored all the time while the process recipe is being executed. Alternatively, a step of the process recipe for monitoring the monitor value of the opening degree of the APC valve may be designated in advance and the monitor value of the opening degree of the APC valve may be monitored in the designated step.

Further, the count of the number-of-times of valve opening/closing may be performed by the pressure controller 19b instead of the processor 19a. Further, in addition to the above-described number-of-times of valve opening/closing, criteria for replacement of the APC valve may be the valve opening/closing time, the area (a flow rate of gas flowing when opening a vertical axis, or a horizontal axis opening period) during one valve opening/closing, etc.

The substrate processing apparatus according to the present disclosure can be applied not only to a semiconductor manufacturing apparatus but also to an apparatus for processing a glass substrate such as a LCD apparatus. Further, the substrate processing apparatus according to the present disclosure does not limit the process in the furnace, and can perform film-forming processes including a CVD, a PVD, a process of forming an oxide film or a nitride film, and a process of forming a film containing metal. Further, the substrate processing apparatus according to the present disclosure can be applied to an exposure apparatus, a lithography apparatus, a coating apparatus, a CVD apparatus using plasma, and the like.

Although the present disclosure has been specifically described above based on the present embodiment, it is needless to say that the present disclosure is not limited to the above embodiment and can be modified in various forms.

According to the present disclosure in some embodiments, it is possible to know in advance the timing of replacement of a pressure control valve.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a processor configured to execute a process recipe to process a substrate; and
a pressure controller configured to control a pressure of a process chamber, in which the substrate is processed, by adjusting an opening degree of a pressure regulating valve provided to an exhaust line of the process chamber,
wherein when controlling the pressure of the process chamber, the pressure controller adjusts the opening degree of the pressure regulating valve and outputs information of the opening degree to the processor, and
wherein while receiving the information of the opening degree from the pressure controller and monitoring an open/close state of the pressure regulating valve, the processor is configured to determine that an open/close cycle of the pressure regulating valve has occurred based on when the received information of the opening degree passes from less than or equal to a minimum value to greater than or equal to a maximum value before then passing to less than or equal to the minimum value.

2. The substrate processing apparatus of claim 1, wherein the processor is configured to, if the received information of the opening degree passes from less than or equal to the minimum value to greater than or equal to the maximum value and then passes to less than or equal to the minimum value, be capable of determining that the open/close cycle of the pressure regulating valve has occurred and counting up a number of times of the open/close cycle of the pressure regulating valve.

3. The substrate processing apparatus of claim 1, wherein the processor is configured to, if the received information of the opening degree does not pass from less than or equal to the minimum value to greater than or equal to the maximum value, be capable of determining that the open/close cycle of the pressure regulating valve has not occurred and not counting up a number of times of the open/close cycle of the pressure regulating valve.

4. The substrate processing apparatus of claim 1, wherein the processor is configured to be capable of counting a number of times of the open/close cycle of the pressure regulating valve as one time if the maximum value is exceeded at least once since the received information of the opening degree exceeds the minimum value and until the received information of the opening degree returns to the minimum value.

5. The substrate processing apparatus of claim 1, wherein the processor is configured to, when the received information of the opening degree reaches the minimum value from a value smaller than the minimum value, be capable of starting monitoring for whether or not the open/close cycle of the pressure regulating valve has occurred.

6. The substrate processing apparatus of claim 1, wherein the minimum value is a value indicating that the received information of the opening degree is larger than 0% for full valve closing, and wherein the maximum value is a value indicating that the received information of the opening degree is smaller than 100% for full valve opening.

7. The substrate processing apparatus of claim 1, wherein the processor is configured to be capable of counting up a number of times of the open/close cycle of the pressure regulating valve at a point of time when the received information of the opening degree transitions to the minimum value after monitoring for whether or not the open/close cycle of the pressure regulating valve has occurred is started at a point of time when the received information of the opening degree transitions to the maximum value.

8. The substrate processing apparatus of claim 1, wherein the processor is configured to, if the received information of the opening degree does not exceed the maximum value and transitions to the minimum value, be capable of not counting up a number of times of the open/close cycle of the pressure regulating valve.

9. The substrate processing apparatus of claim 1, wherein the processor is configured to, if a number of times of the open/close cycle of the pressure regulating valve reaches a preset upper limit value, be capable of issuing an alarm.

10. The substrate processing apparatus of claim 9, wherein the processor is configured to, if the alarm is detected during execution of the process recipe, be capable of prohibiting transferring a substrate to be processed in a next process recipe.

11. The substrate processing apparatus of claim 1, wherein the pressure controller is configured to be capable of outputting the information of the opening degree to the processor when a pressure of the process chamber is maintained at a predetermined pressure or when the pressure of the process chamber is changed to a predetermined pressure.

12. The substrate processing apparatus of claim 1, wherein the processor is configured to be capable of acquiring the information of the opening degree from the pressure controller while executing the process recipe.

13. The substrate processing apparatus of claim 1, further comprising an operator configured to be capable of displaying a number of times of the open/close cycle of the pressure regulating valve,
wherein the operator is configured to be capable of setting the number of times of the open/close cycle of the pressure regulating valve to a certain number.

14. A non-transitory computer-readable recording medium storing a program executed in a substrate processing apparatus comprising a processor configured to execute a process recipe to process a substrate, and a pressure controller configured to control a pressure of a process chamber, in which a substrate is processed, by adjusting an opening degree of a pressure regulating valve provided to an exhaust line of the process chamber,
the program, executed by a computer, causing the substrate processing apparatus to:
adjust the opening degree of the pressure regulating valve and output information of the opening degree to the processor; and
while receiving the information of the opening degree from the pressure controller and monitoring an open/close state of the pressure regulating valve, determine that an open/close cycle of the pressure regulating valve has occurred based on when the received information of the opening degree passes from less than or equal to a minimum value to greater than or equal to a maximum value and before then passing to less than or equal to the minimum value.

\* \* \* \* \*